US006316835B1

United States Patent
Chen et al.

(10) Patent No.: US 6,316,835 B1
(45) Date of Patent: Nov. 13, 2001

(54) METHOD FOR FORMING ZIG-ZAG BORDERED OPENINGS IN SEMICONDUCTOR STRUCTURES AND STRUCTURES FORMED

(75) Inventors: C. H. Chen; Y. C. Chao; Y. M. Tsui, all of Hsin-Chu; W. R. Chang, Taipei, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/113,625

(22) Filed: Jul. 10, 1998

Related U.S. Application Data

(62) Division of application No. 08/795,952, filed on Feb. 28, 1997, now Pat. No. 5,874,356.

(51) Int. Cl.[7] ............. H01L 23/48; H01L 23/52; H01L 29/40

(52) U.S. Cl. .............. 257/774; 257/773; 257/786

(58) Field of Search .................... 257/618, 774, 257/773, 786, 506, 484

(56) References Cited

U.S. PATENT DOCUMENTS

| 5,270,256 | * | 12/1993 | Bost et al. ............. 257/484 |
| 5,583,380 | * | 12/1996 | Larsen et al. ............. 257/774 |
| 5,691,571 | * | 11/1997 | Hirose et al. ............. 257/774 |

* cited by examiner

*Primary Examiner*—Steven Loke
(74) *Attorney, Agent, or Firm*—Tung & Associates

(57) ABSTRACT

The present invention discloses a via plug formed in a zig-zag bordered opening in a semiconductor structure wherein the film stress in a barrier/glue layer TiN can be significantly reduced to eliminate the occurrence of volcano defect in which delamination or peeling of the TiN layer from the contact opening occurs. The via plug can be formed in a process by providing a mask that has a desirable zig-zag pattern during a photomasking step performed on the semiconductor device.

2 Claims, 2 Drawing Sheets

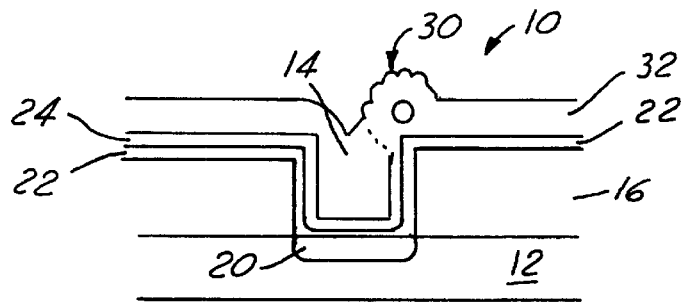
(PRIOR ART)
FIG. 1
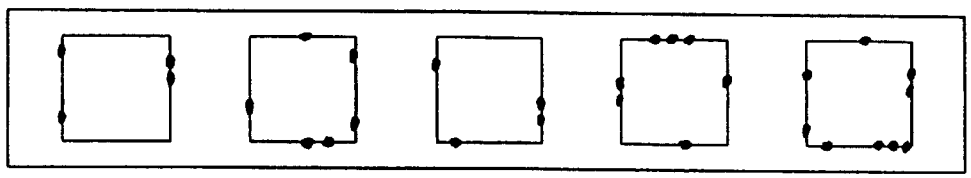
(PRIOR ART)
FIG. 2
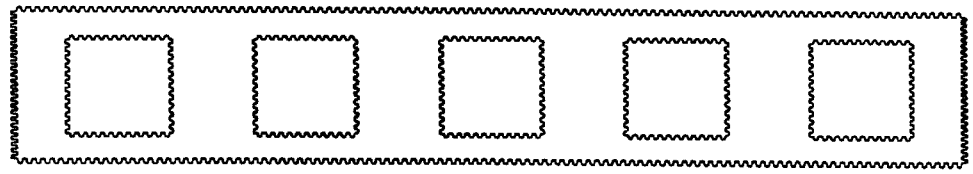
FIG. 3
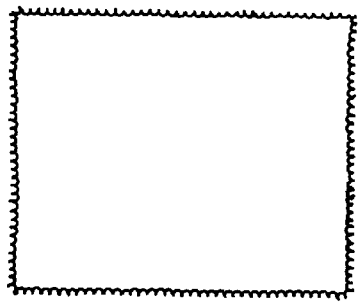     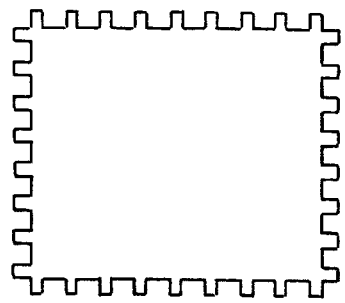
FIG. 4A               FIG. 4B

METHOD FOR FORMING ZIG-ZAG BORDERED OPENINGS IN SEMICONDUCTOR STRUCTURES AND STRUCTURES FORMED

This is a divisional of application Ser. No. 08/795,952 filed on Feb. 28, 1997, now U.S. Pat. No. 5,874,356.

FIELD OF THE INVENTION

The present invention generally relates to a method for forming an opening in a semiconductor structure and more particularly, relates to a method for forming a zig-zag bordered opening in a semiconductor structure for a bond pad such that when a tungsten plug is subsequently formed therein, the stress in an underlying layer of titanium nitride is reduced to avoid the formation of volcano defect.

BACKGROUND OF THE INVENTION

In the fabrication of semiconductor devices, connections to the semiconductor device are typically accomplished by metallic connection points or bond pads (I/O pads) that are disposed on a planar surface of the device (or die) around the periphery thereof. Once the functionality and the circuit requirements of a semiconductor device are met in the design, the required number of bond pads for operating the device can be determined. The bond pads are normally positioned on a semiconductor device in a peripheral area which is a ring-shaped area on the surface of the device or a narrow band between the edges of the device and an interior area of the device. One of the reasons that bond pads are disposed around the edges of a device is that the peripheral location permits a relatively large number of I/O connections to the die without causing the connections to cross one another.

Bond pads are formed in a metal conductor layer deposited and then patterned on the top surface of a semiconductor device. The metal conductor layer is frequently embedded in an insulating layer of a dielectric material. In order to establish electrical communication with the bond pads, a contact plug is normally used which is formed of a conductive metal material such as tungsten or aluminum.

The bond pad openings (or contact openings), when filled with an appropriate conductive material form void-free contact plugs and exhibit low contact resistance to the underlying and overlying conductors. Other than metallic materials such as tungsten and aluminum, heavily doped polysilicon can also be used in contact plugs. For instance, polysilicon can be doped n-type when contacting N-regions and p-type for P-regions to avoid inter-diffuision and dopant migration. When a metallic material such as tungsten or aluminum is used to fill a contact window, the window is typically lined with a thin layer of titanium or titanium/titanium nitride (TiN) prior to the contact plug fill. Other similar compositions such as titanium tungsten and tungsten can also be used. The main purpose of titanium is to improve the contact resistance. The TiN film is deposited to act as a diffusion barrier to certain elements such as silicon from the substrate and fluorine generated during a tungsten chemical vapor deposition process. The thin layer of Ti or TiN also act as a glue layer to improve adhesion to tungsten. The layers may further act as a wetting film to enhance the reflow of aluminum. The liner of Ti and TiN are typically deposited by a collimated sputtering process or a chemical vapor deposition process. A desirable thickness for the Ti layer is between about 200 Å and about 800 Å, while the same for the TiN layer is between about 800 Å and about 2500 Å.

Contact hole openings can be filled by depositing tungsten in a chemical vapor deposition or a sputtering process and then planarizing the metal by etching it back to the insulator surface or by a chemical mechanical polishing process such that only tungsten is left in the contact openings. Tungsten CVD is used for contact hole filling and is typically performed by the pyrolitic decomposition of tungsten hexafluoride ($WF_6$), or by the reduction of $WF_6$ with hydrogen, silicon or silane. In semiconductor manufacturing, reduction $WF_6$ at a temperature between 250° C.~600° C. is more frequently used.

In the tungsten plug process, TiN is used as a barrier layer and a glue layer. However, TiN grains have a columnar structure which allows fluorine from the reaction precursor to easily migrate through the crevices of TiN to react with an underlying titanium layer during the tungsten deposition process. The fluorine causes the peeling of the glue layer TiN and the tungsten layer deposited. A conventional tungsten plug formation that has the volcano defect is shown in FIG. 1.

FIG. 1 illustrates a semiconductor device that is built on a semi-conducting substrate 12. A contact hole 14 is opened through an inter-level dielectric layer 16 to provide communication with the source/drain active region 20. Inside the contact hole and on top of the inter-level dielectric layer 16, barrier layers of titanium 22 and titanium nitride 24 are deposited. A layer of conductive metal such as tungsten 32 is then deposited by a chemical vapor deposition (CVD) process over the surface of the substrate 12 to fill the contact hole 14.

During the tungsten CVD process, fluorine from the reactant precursor $WF_6$ migrate through the TiN film 24 to react with the titanium layer 22 and cause the peeling of the tungsten and the TiN layer from the substrate 12. This is shown in FIG. 1. The volcano effect, shown as 30 in FIG. 1, reflects the delamination of the tungsten and titanium nitride layers from the substrate 12. The two layers are separated or peeled away from the substrate 12. It is believed that during tungsten CVD $WF_6$ reacts with the underlying layer of Ti to produce W and $TiF_3$. Since $TiF_3$ is a material that has poor adhesion to tungsten, it does not adhere to and peels away from the tungsten layer 22. A plane view of a semiconductor structure having typical bond pad openings is illustrated in FIG. 2, showing the openings are formed by straight line borders. The black dots shown in FIG. 2 along the bond pad openings are the volcano defects.

Others have attempted to improve the tungsten plug process and to avoid the volcano defect. One such method is an annealing process of a rapid thermal annealing method to improve the density and thus to reduce voids in a TiN film. The theory is that oxygen or nitrogen products can be used to stuff the TiN grain boundaries such that fluorine cannot penetrate through. However, the annealing method is a time-consuming process which creates a bottle neck in the total semiconductor fabrication process.

It is therefore an object of the present invention to provide a method for forming bond pad windows in a semiconductor structure that does not have the drawbacks and shortcomings of the conventional tungsten plug process.

It is another object of the present invention to provide a method for forming bond pad windows in a semiconductor structure that provides windows of reduced stress in the underlying TiN barrier layer without the formation of volcano defect.

It is a further object of the present invention to provide a method for forming bond pad windows in a semiconductor structure that does not create straight-line border bond pad openings.

It is another further object of the present invention to provide a method for forming zig-zag bordered opening in a semiconductor structure that creates openings of substantially reduced stress in an underlying TiN barrier layer.

It is still another object of the present invention to provide a method for forming zig-zag bordered openings in a semiconductor structure that creates openings having saw-tooth configuration in the borders of the openings.

It is yet another object of the present invention to provide a method for forming zig-zag bordered bond pad openings in a semiconductor structure wherein the pitch of the zig-zag border created between about 2 micron and about 6 micron.

SUMMARY OF THE INVENTION

In accordance with the present invention, a method for forming a zig-zag bordered opening in a semiconductor structure to reduce the stress in a titanium nitride film in the opening such that the peeling of the titanium nitride film and a subsequently deposited tungsten metal plug can be prevented to avoid the volcano defect.

In a preferred embodiment, a method for forming a zig-zag bordered opening in a semiconductor structure can be carried out by the operating steps of first providing a pre-processed semiconductor structure that has a dielectric layer deposited on top, then depositing a photoresist layer on top of the dielectric layer, then photomasking a pattern of a zig-zag bordered opening in the photoresist layer, and finally etching into the dielectric layer an opening which has a zig-zag border.

In an alternate embodiment, a method for forming a saw-tooth bordered contact window in a semiconductor structure can be carried out by the operating steps of first providing a pre-processed semi-conducting substrate that has an active region on top, then depositing a dielectric layer overlying the active region, then depositing a photoresist layer on the dielectric layer and masking a pattern of a saw-tooth bordered contact window in the photoresist layer, and finally dry etching through the dielectric layer a contact window that has a saw-tooth border.

The present invention is further directed to a semiconductor structure that consists of a semi-conducting substrate, an active region formed in the substrate, and a dielectric layer overlying the active region and has a zig-zag bordered opening formed therein to expose the active region.

BRIEF DESCRIPTION OF THE DRAWINGS

These and other objects, features and advantages of the present invention will become apparent from the following detailed description and the appended drawings in which:

FIG. 1 is an enlarged, cross-sectional view of a tungsten plug formed in a conventional semiconductor structure that has the volcano defect.

FIG. 2 is a plane view of a plurality of bond pads in a semiconductor structure that have the volcano defect.

FIG. 3 is a plane view of the present invention zig-zag bordered bond pad windows.

FIGS. 4A~4C are enlarged plane views of the present invention zig-zag bond pad windows of different pitch lengths.

DETAILED DESCRIPTION OF THE PREFERRED EMBODIMENT

Figure 4C:
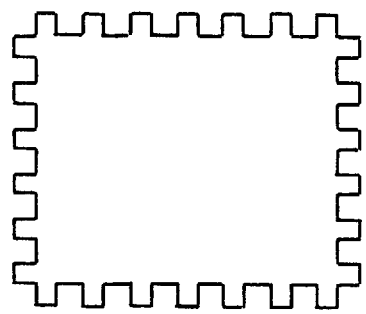

The present invention provides a novel method of forming zig-zag bordered openings in semiconductor structures such as for bond pads or for chip seal rings. By utilizing the zig-zag bordered design, the stress in a titanium nitride film deposited in the opening as a barrier/glue layer and in the tungsten plug deposited thereon is greatly reduced. The reduced stress substantially eliminates the occurrence of volcano defect which causes delamination or peeling of the titanium nitride film and the tungsten plug from the opening. The present invention novel method therefore provides an effective means of eliminating such defect without any additional processing costs. The only modification required to the present fabrication process is the formation of a zig-zag pattern for the bond pad opening or for the seal ring on a chip which can be easily accomplished in a masking process. The benefits achievable by the novel present invention method can be demonstrated by a series of experiments illustrated below.

Volcano defect normally occurs at bond pad openings and chip edge caused by the length of the border of the openings or the edge which contributes to high film stress in the TiN film deposited at these locations. A TiN film is deposited in the contact opening on top of a titanium layer as a barrier/glue layer to prevent silicon migration and to promote adhesion with a tungsten plug that is subsequently deposited. The underlying titanium layer is used to improve the electrical conductance with the substrate.

A major factor in the formation of volcano defect is the high film stress existed both in the TiN layer and in the Ti layer. Since film stress on a semiconductor chip depends on many factors, i.e.:

| | | $\sigma = \kappa(ds - dsi) \Delta T(Ea \cdot Es \cdot L/x)^{\frac{1}{2}}$ | |
|---|---|---|---|
| where | $\sigma$: | Stress on the IC chip | (kg/mm$^2$) |
| | $\kappa$: | Constant | |
| | ds: | Coefficient of linear expansion of leadframe | (l/° C.) |
| | dsi: | Coefficient of linear expansion of IC chip | (l/° C.) |
| | $\Delta T$: | Temperature difference | (° C.) |
| | Ea: | Flexural modulus of die-attach paste | (kg/mm$^2$) |
| | Es: | Flexural modulus of leadframe | (kg/mm$^2$) |
| | L: | Length of chip | (mm) |
| | X: | Thickness of paste layer | (mm) |

The relation of the stress in the TiN film with the length of the bond pad border (L) is therefore:

$\sigma \approx L^{1/2}$

It is therefore obvious that by reducing the length of the bond pad border and the chip edge, the stress in the TiN film should be correspondingly reduced. This leads to a reduction in the occurrence of the volcano defect.

To demonstrate the effectiveness of the present invention method, the following experiments were conducted:

| Type 1 | Flat edge; A Block #7~11; 17~22 |
|---|---|
| Type 2 | ZigZag (1 um pitch); A Block #1~6; #12~16 |
| Type 3 | ZigZag (2 um pitch); B Block #7~11; #17~22 |
| Type 4 | ZigZag (3 um pitch); B Block #1~6; #12~16 |
| Type 5 | ZigZag (4 um pitch); C Block #7~11; #17~22 |
| Type 6 | ZigZag (5 um pitch); C Block #1~6; #12~16 |

A typical present invention bond pad arrangement that has zig-zag borders is shown in FIG. 3 in a plane view. One of the desirable zig-zag borders can be formed in a saw-tooth configuration. The type 2 samples that have a pitch of 1 micron is shown in FIG. 4A, the Type 5 samples that have a pitch of 4 micron is shown in FIG. 4B, while the Type 6 samples that have a pitch of 5 micron is shown in FIG. 4C.

Figure 5:
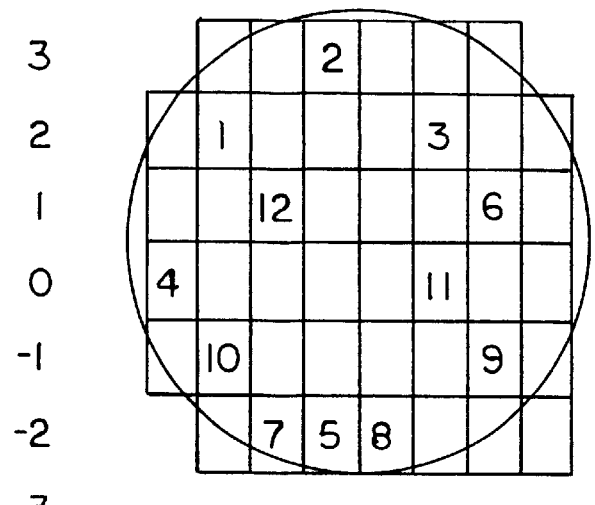
FIG. 5 is a plane view of a sample wafer for illustrating the present invention method.

Tests on wafers 1~3 without the rapid thermal annealing treatment on the barrier TiN layer were conducted. On each wafer, 12 different fields were tested to obtain an average value representing the wafer. The distribution of the twelve different fields on a wafer is shown in FIG. 5. The random distribution of the different fields on the wafer assures the reliability of data obtained.

After the completion of the tungsten plug formation, a volcano defect count is conducted on each of the samples. The data obtained are illustrated in Table 1. Instead of tungsten, aluminum may also be used to fill the via openings for forming the via plugs.

TABLE I

|  | Type.1 | Type.2 | Type.3 | Type.4 | Type.5 | Type.6 |
|---|---|---|---|---|---|---|
| Wafer 1 | 206 | 46 | 5 | 1 | 2 | 1 |
| Wafer 2 | 524 | 90 | 3 | 3 | 5 | 7 |
| Wafer 3 | 195 | 61 | 0 | 1 | 3 | 4 |

A representative volcano defect distribution of wafer 5 is illustrated in Table II.

TABLE II

| Field | Type.1 | Type.2 | Type.3 | Type.4 | Type.5 | Type.6 |
|---|---|---|---|---|---|---|
| 1 | 52 | 1 |  |  |  |  |
| 2 | 50 | 4 |  |  |  |  |
| 3 | 24 | 3 |  |  | 2 | 2 |
| 4 | 82 | 15 | 1 | 3 |  | 1 |
| 5 | 0 | 0 |  |  |  |  |
| 6 | 34 | 10 |  |  |  |  |
| 7 | 80 | 15 | 2 |  | 3 | 4 |
| 8 | 43 | 2 |  |  |  |  |
| 9 | 52 | 19 |  |  |  |  |
| 10 | 57 | 10 |  |  |  |  |
| 11 | 35 | 5 |  |  |  |  |
| 12 | 20 | 1 |  |  |  |  |

Figure 6:
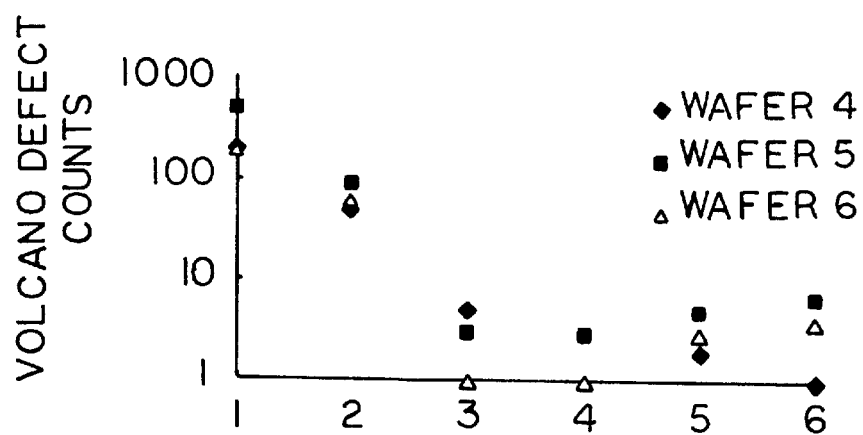
FIG. 6 is a graph illustrating the effect of different pitch lengths on the volcano defect formation.

The data shown in Table II is also plotted in a graph for easier inspection. This is shown in FIG. 6.

It can be seen from Table II (or FIG. 6), samples that have the Type 2, Type 3, Type 4, Type 5 and Type 6 pitch of the zig-zag pattern show the effectiveness of the zig-zag border (and thus a smaller total border length) for the prevention of the volcano defect. It is theorized that in a saw-tooth configuration of the zig-zag pattern shown in FIGS. 4A~4C, the stress on the border of a bond pad opening or on a seal ring around a chip is not cumulative each time when the border line turns 90 degrees. Thus, when only the bottom of the pitch is counted as the border length, the total border length is substantially reduced from the original straight line borders. Since stress is directly proportional to the square root of the border length, it is correspondingly reduced. This accounts for the significant reduction of film stress in the TiN layer and the tungsten layer such that the occurrence of delamination or peeling-off from the contact hole is substantially reduced.

The present invention novel method has been amply demonstrated by the above data and illustrations. The same processing steps for forming the zig-zag openings for the bond pads may be used to form openings for seal rings around a chip. It should be noted that while only bond pads and seal rings around a chip are used as examples, the present invention method can be equally applied to other types of openings in a dielectric layer formed on any semiconductor devices as long as the reduction of film stress in a layer deposited in the opening is desired. Therefore, if delamination or peeling-off occurs in any other metal deposition layers in the opening of a semiconductor chip, the present invention method can be equally applied to achieve the same desirable effect.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A semiconductor structure comprising:
   a semi-conducting substrate,
   a via opening formed in said substrate,
   a dielectric layer overlying said substrate except said via opening, a zig-zag bordered opening in a saw-tooth configuration having a pitch between about 2 micron and about 6 micron formed in said dielectric layer exposing said semi-conducting substrate in said via opening, said zig-zag bordered opening is a bond pad opening, and
   a conductive material filling said bond pad opening forming a contact.

2. A semiconductor structure according to claim 1 further comprising a plug of tungsten or aluminum filling said opening.

* * * * *